United States Patent [19]
Guo

[11] Patent Number: 6,163,039
[45] Date of Patent: Dec. 19, 2000

[54] TRIANGULAR-BARRIER OPTOELECTRONIC SWITCH

[75] Inventor: Der-Feng Guo, Kaoshiung, Taiwan

[73] Assignee: National Science Council, Taipei, Taiwan

[21] Appl. No.: 09/135,600

[22] Filed: Aug. 18, 1998

[51] Int. Cl.[7] .................................................. H01L 33/00
[52] U.S. Cl. ............................ 257/103; 257/105; 257/14
[58] Field of Search ............................... 257/186, 39, 105, 257/85, 103, 14

[56] References Cited

U.S. PATENT DOCUMENTS

| | | |
|---|---|---|
| 4,686,550 | 8/1987 | Capasso et al. . |
| 5,416,338 | 5/1995 | Suzuki et al. . |
| 5,663,572 | 9/1997 | Sakata et al. . |
| 5,952,683 | 9/1999 | Sakata et al. . |

OTHER PUBLICATIONS

Guo, Der–Feng, "Bistable GaAs–InGaP triangular–barrier optoelectronic switch", Appl. Phys. Lett. 71 (9), Sep. 1, 1997, pp. 1219–1221.

Malik et al., "Rectifying, Variable Planar–Doped–Barrier Structures in GaAs", Inst. Phys. Conf. Ser. No. 56: Chapter 9, pp. 697–709, 1980.

*Primary Examiner*—Stephen D. Meier
*Attorney, Agent, or Firm*—Fish & Richardson P.C.

[57] ABSTRACT

A GaAs-InGaP triangular-barrier optoelectronic switch (TBOS) is disclosed, wherein two i-InGaP layers are formed on both sides of the $p^+$-GaAs layer in the conventional triangular-barrier structure. By introducing avalanche multiplication and carrier confinement into the device operation, S-shaped negative-differential-resistance (NDR) performances are observed in the I-V (current-voltage) characteristic curves under normal and reverse operation modes. Moreover, the TBOS of the present invention shows a flexible optical function because the barrier height is associated with incident light. Owing to the incident light changing the potential barrier height for the electrons thermionically emitted over it, the I-V characteristics of the TBOS are optically controllable.

19 Claims, 3 Drawing Sheets

TRIANGULAR-BARRIER OPTOELECTRONIC SWITCH

FIELD OF THE INVENTION

The present invention is related to a triangular-barrier optoelectronic switch, and in particular to a GaAs-InGaP triangular-barrier optoelectronic switch of which the I-V characteristics are optically controllable.

BACKGROUND OF THE INVENTION

In optical computing, various optical devices are required for functions such as memory, logic, etc. To reach these goals, the semiconductor device research has focused on the optoelectronic switch with nonlinear optical response. Several devices, such as the $p^+$-$n^+$-$p^+$-$n^+$ heterojunction bipolar phototransistors and the p-n-p-n double-heterostructure optoelectronic switches, have been developed for this purpose. In the characteristics of these devices, the avalanche multiplication in the reverse-biased region, and the hole confinement at the potential minimum are the causes for producing the negative differential resistance (NDR). However, the minority-carrier storage slows down the response speed of these devices. Furthermore, because the on-state current-voltage (I-V) characteristics of these devices are nearly independent of incident light, it is hard to reset them to the off-state optically unless a high resistance is connected, which is also harmful to high speed operation. Therefore, it is important to develop a switch which is free from minority-carrier storage and whose I-V characteristics can be controlled by the incident light power. For these purposes, the $n^+$-i-$p^+$-i-$n^+$ triangular-barrier (TB) structure is one of the possible candidates. This device was first made by inserting a $p^+$-GaAs layer into an i-GaAs layer with $n^+$-GaAs layers on both sides. However, it is suitable for rectifying, not for switch application. To work a TB device as an optoelectronic switch, it is also necessary to introduce the avalanche multiplication and hole confinement into the device operation.

SUMMARY OF THE INVENTION

In this invention, a GaAs-InGa(Group V) triangular-barrier optoelectronic switch (TBOS) is proposed. The InGa (Group V) layers located on both sides of the $p^+$-GaAs layer in a TB structure are employed to enhance the hole confinement. By introducing the avalanche multiplication and hole confinement into the device operation, the TBOS of the present invention shows S-shaped negative-differential-resistance (NDR) performances in the I-V (current-voltage) characteristic curves under normal and reverse operation modes. Moreover, the TBOS of the present invention shows a flexible optical function because the barrier height is associated with incident light. Owing to the incident light changing the potential barrier height for the electrons thermionically emitted over it, the I-V characteristics of the TBOS are optically controllable.

A TBOS constructed according to the present invention comprises: a GaAs substrate; a GaAs buffer layer on a first surface of the GaAs substrate; a GaAs drain layer on the buffer layer; an InGaV first barrier layer on the drain layer, wherein V represents one or more elements of group V of the periodic table; a GaAs gate layer on the first barrier layer; an InGaV second barrier layer on the gate layer, wherein V is defined as above; a GaAs source layer on the second barrier layer; a GaAs cap layer on the source layer; an ohmic contact metal layer on the cap layer as a first electrode; and an ohmic contact metal layer on a second surface of the substrate as a second electrode.

The first and second barrier layers may have the same composition or different compositions, and a suitable first and second barrier layers are an undoped InGaV layer having a formula of i-$In_{1-x}Ga_xP_{1-x}As_y$, wherein 0<x<1 and 0≦y≦1 Preferably, x is about 0.51, and y is 0.

DETAILED DESCRIPTION OF A PREFERRED EMBODIMENT OF THE INVENTION

Figure 1:
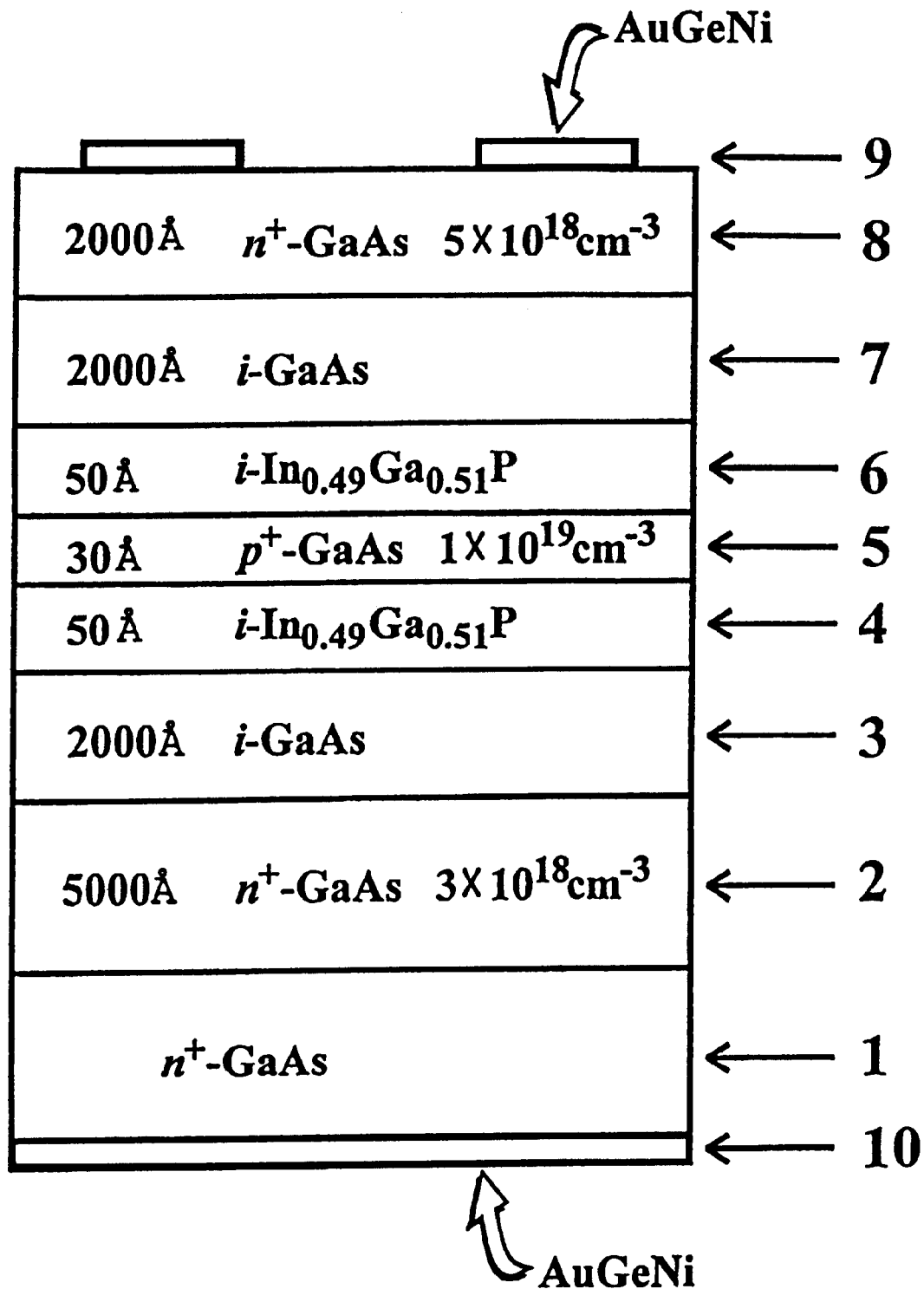
FIG. 1 is a schematic cross-sectional view showing the structure of a GaAs-InGaP triangular-barrier optoelectronic switch (TBOS) constructed according to a preferred embodiment of the present invention.

A GaAs-InGaP triangular-barrier optoelectronic switch (TBOS) constructed according to a preferred embodiment of the present invention is shown in FIG. 1. As shown in FIG. 1, two i-InGaP layers are formed on both sides of the $p^+$-GaAs layer in the conventional triangular-barrier structure.

The TBOS of the present invention was grown by metalorganic chemical vapor deposition (MOCVD) on a (100)-oriented $n^+$-GaAs substrate 1. The TBOS comprises a 5000 Å $n^+$-GaAs ($3 \times 10^{18}$ cm$^{-3}$) buffer layer 2 on a top surface of the substrate 1; a 2000 Å i-GaAs drain layer 3 on the buffer layer 2; a 50 Å i-$In_{0.49}Ga_{0.51}P$ first barrier layer 4 on the drain layer 3; a 30 Å $p^+$-GaAs ($1 \times 10^{19}$ cm$^{-3}$) gate layer 5 on the first barrier layer 4; a 50 Å i-$In_{0.49}Ga_{0.51}P$ second barrier layer 6 on the gate layer 5; a 2000 Å i-GaAs source layer 7 on the second barrier layer 6; and a 2000 Å $n^+$-GaAs ($5 \times 10^8$ cm$^{-3}$) cap layer 8 on the source layer 7. After finishing the growth, the mesa etching was finished by employing $NH_4OH:H_2O_2:H_2O$ and $HCl:H_2O$ solutions to remove GaAs and InGaP layers, respectively. AuGeNi metal was used as n-typed contacts 9 and 10 on the cap layer 8 and the bottom surface of the substrate 1, respectively. The completed device has a circular mesa with an area of $5.1 \times 10^{-5}$ cm$^{-2}$.

Figure 2:
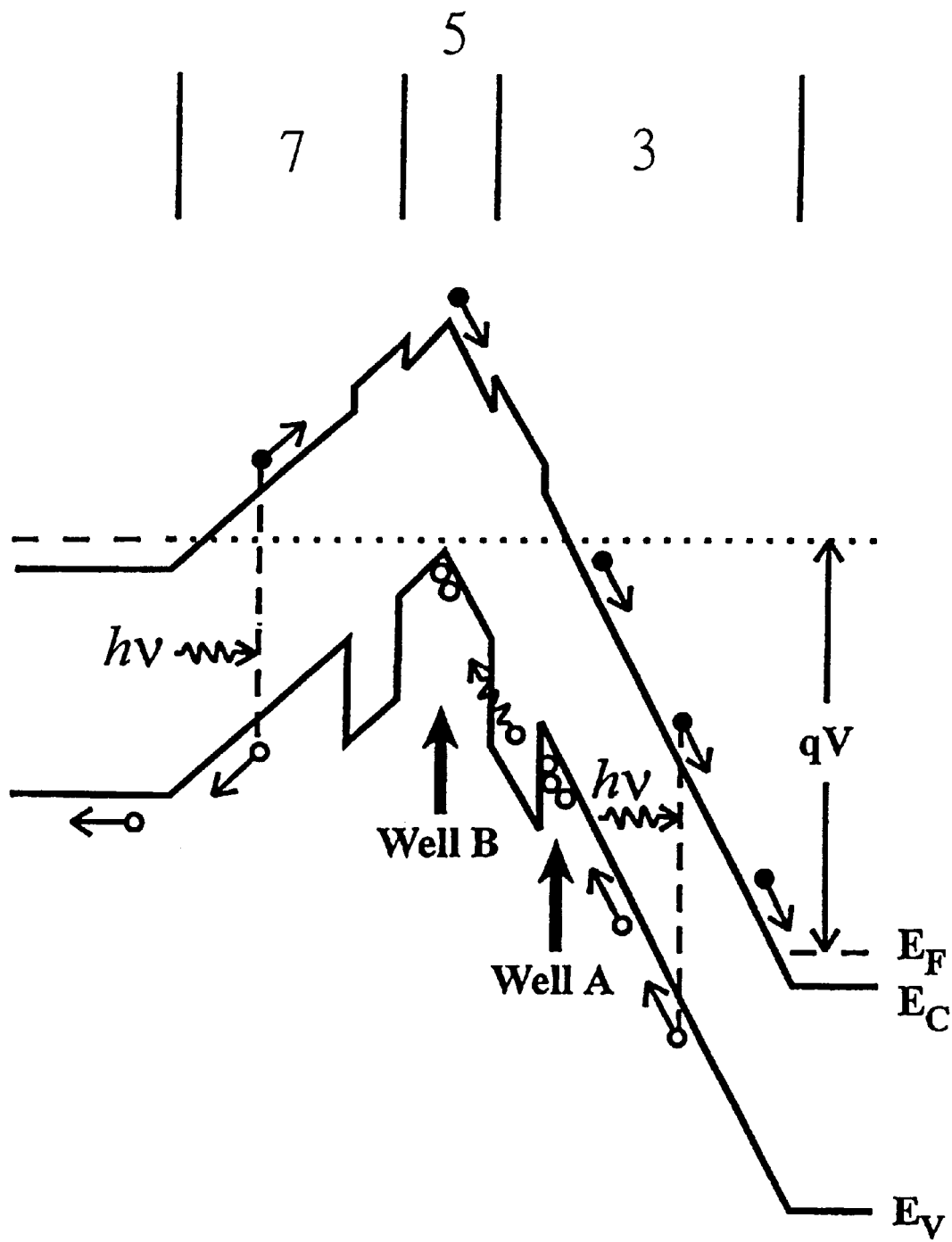
FIG. 2 is an energy band diagram of a biased TBOS shown in FIG. 1 with incident photons, and photogenerated electrons (black dots) and holes (circles).

FIG. 2 shows the band diagram of a biased TBOS shown in FIG. 1 with incident photons. The device is operated with the drain region biased positively with respect to the source. As the thickness of the two InGaP layers 4 and 6 are all of only 50 Å and the conduction band discontinuity of the GaAs-InGaP system is small, the electrons injected from the source is easily to tunneling through the InGaP layers 4 and 6. Consider photons with energies higher than the band-gap energy of GaAs incident from the source side 7 when the drain is biased positively. Electron-hole pairs will be generated mostly in the GaAs source layer 7 and drain layer 3 for the gate layer 5 has a thickness of only 30 Å. In the source layer 7, photogenerated electrons (black dots) will travel over the gate layer 5 and the holes (circles) will move in the opposite direction because of the forward-bias condition, as shown in FIG. 2. In the drain layer 3, photogenerated electron-hole pairs will be separated by the existing electric field. Holes will experience the InGaP barrier in the drain region. Owing to the thickness of the InGaP layer 4 of 50 Å, part of the holes will be confined in well A, and part of them will tunnel through the InGaP layer 4 and be confined at the potential minimum, the well B, as shown in FIG. 2. The holes confined in wells A and B will lower the potential barrier of the gate. If a sufficient external voltage is applied to the device, the avalanche multiplication can be occur in the drain 3. Multiplied holes will also be confined in the wells to lower the barrier and then increase the electrons emitted over the barrier from the source 7 to drain 3. This positive feedback process will result in an S-shaped NDR performance in the I-V characteristics. Because the characteristic of the device is influenced by the input-light power, we can control the switching by changing the input-light.

Figure 3A:
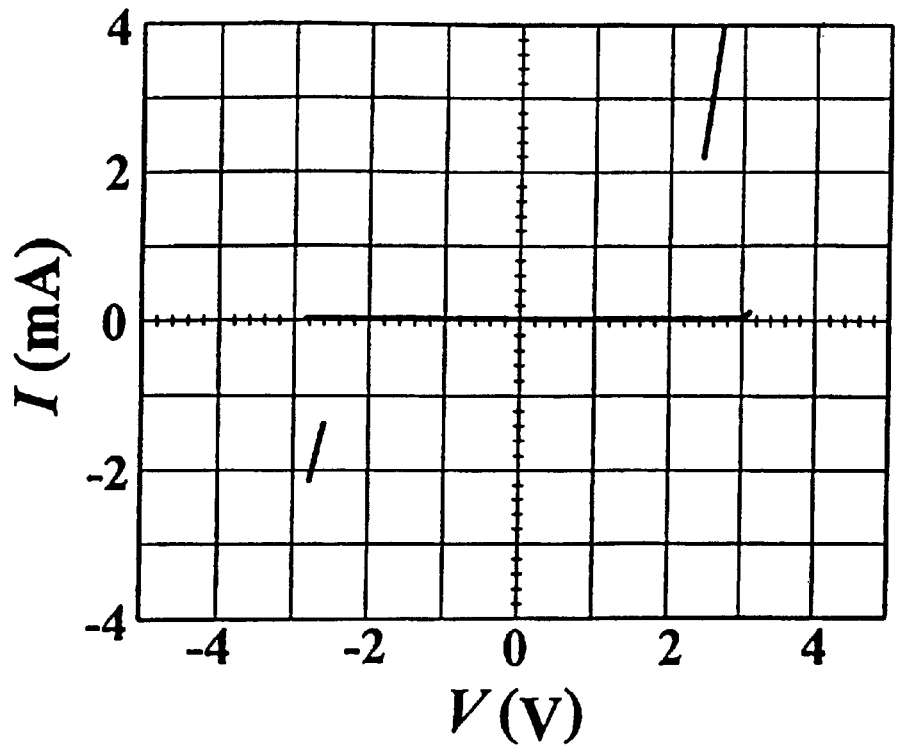
FIG. 3a and FIG. 3b shows I-V characteristics of the TBOS shown in FIG. 1 without incident light (a) and with incident light (b), respectively.
Figure 3B:
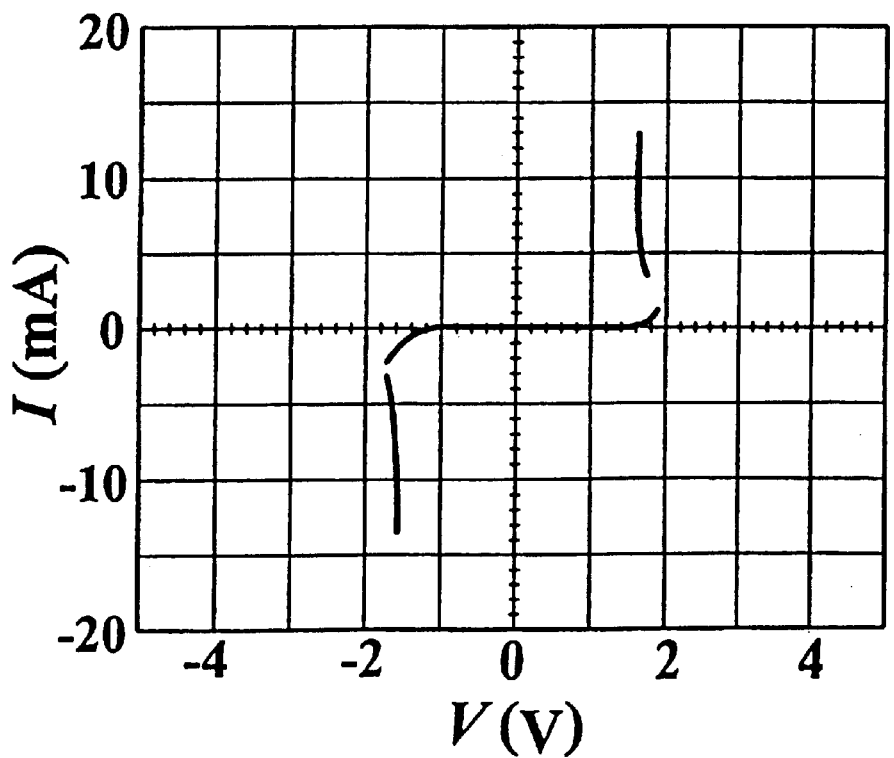

FIGS. 3a and 3b show the I-V characteristics of the TBOS shown in FIG. 1 under dark and illumination conditions at 300 K. The symmetric structure of the TBOS makes the characteristics symmetric. S-shaped NDR performances are observed under both normal and reverse operations. Under illumination, because the barrier is lowered by the photo-generated holes confined in wells A and B, a smaller external bias is enough to inject electrons over the barrier, and then cause the avalanche multiplication in the drain region and initiate the NDR phenomenon. Thus the switching voltage under illumination is smaller than that under dark, as shown in FIGS. 3a and 3b. Also owing to the photogenerated confined holes lowering the barrier, the switching current is larger under illumination. In summary, the I-V characteristics of the TBOS of the present invention are optically controllable.

What is claimed is:

1. A triangular-barrier optoelectronic switch comprising a GaAs substrate; a GaAs buffer layer on a first surface of the GaAs substrate; a GaAs drain layer on the buffer layer; an InGaV first barrier layer on the drain layer, wherein V represents one or more elements of group V of the periodic table; a GaAs gate layer on the first barrier layer; an InGaV second barrier layer on the gate layer, wherein V is defined as above; a GaAs source layer on the second barrier layer; a GaAs cap layer on the source layer; an ohmic contact metal layer on the cap layer as a first electrode; and an ohmic contact metal layer on a second surface of the substrate as a second electrode.

2. The triangular-barrier optoelectronic switch according to claim 1, wherein said first and second barrier layers have the same composition or different compositions, and said first and second barrier layers are an undoped InGaV layer having a formula of i-$In_{1-x}Ga_xP_{1-y}As_y$, wherein $0<x<1$ and $0 \leq y \leq 1$.

3. The triangular-barrier optoelectronic switch according to claim 2, wherein x is about 0.51, and y is 0.

4. The triangular-barrier optoelectronic switch according to claim 1, wherein said substrate is n-type $n^+$-GaAs.

5. The triangular-barrier optoelectronic switch according to claim 1, wherein said buffer layer is n type $n^+$-GaAs.

6. The triangular-barrier optoelectronic switch according to claim 1, wherein said drain layer is undoped i-GaAs.

7. The triangular-barrier optoelectronic switch according to claim 1, wherein said gate layer is p-type $p^+$-GaAs.

8. The triangular-barrier optoelectronic switch according to claim 1, wherein said source layer is undoped i-GaAs.

9. The triangular-barrier optoetectronic switch according to claim 1, wherein said cap layer is n-type $n^+$-GaAs.

10. The triangular-barrier optoelectronic switch according to claim 1, wherein said first and second electrodes are AuGeNi.

11. The triangular-barrier optoelectronic switch according to claim 5, wherein said buffer layer has a thickness of about 5000 Å and a n-type dopant concentration of $n^+=3\times10^{18}$ $cm^{-3}$.

12. The triangular-barrier optoelectronic switch according to claim 6, wherein said drain layer has a thickness of about 2000 Å.

13. The triangular-barrier optoelectronic switch according to claim 2, wherein said first barrier layer has a thickness of about 50 Å.

14. The triangular-barrier optoelectronic switch according to claim 3, wherein said first barrier layer has a thickness of about 50 Å.

15. The triangular-barrier optoelectronic switch according to claim 7, wherein said gate layer has a thickness of 30 Å and a p-type dopant concentration of $p^+=1\times10^{19}$ $cm^{-3}$.

16. The triangular-barrier optoelectronic switch according to claim 2, wherein said second barrier layer has a thickness of about 50 Å.

17. The triangular-barrier optoelectronic switch according to claim 3, wherein said second barrier layer has a thickness of about 50 Å.

18. The triangular-barrier optoelectronic switch according to claim 8, wherein said source layer has a thickness of about 2000 Å.

19. The triangular-barrier optoelectronic switch according to claim 9, wherein said cap layer has a thickness of about 2000 Å and a n-type dopant concentration of $n^+=5\times10^{18}$ $cm^{-3}$.

* * * * *